(12) United States Patent
Chu et al.

(10) Patent No.: US 8,368,152 B2
(45) Date of Patent: Feb. 5, 2013

(54) MEMS DEVICE ETCH STOP

(75) Inventors: Chia-Hua Chu, Zhubei (TW); Yi Heng Tsai, Hsinchu (TW); Kai-Chih Liang, Zhubei (TW); Chia-Pao Shu, Hsinchu (TW); Li-Cheng Chu, Taipei (TW); Kuei-Sung Chang, Kaohsiung (TW); Hsueh-An Yang, Taipei (TW); Chung-Hsien Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 13/089,027

(22) Filed: Apr. 18, 2011

(65) Prior Publication Data

US 2012/0261830 A1 Oct. 18, 2012

(51) Int. Cl.
*H01L 29/84* (2006.01)
*H01L 27/14* (2006.01)
*H01L 21/00* (2006.01)
*G01P 15/08* (2006.01)

(52) U.S. Cl. ........ 257/415; 257/416; 257/417; 257/431; 257/E31.11; 438/49; 438/50; 438/53; 438/54; 438/57

(58) Field of Classification Search .......... 257/415–417, 257/431, E31.11; 438/49, 50, 53, 54, 56, 438/57
See application file for complete search history.

(56) References Cited

U.S. PATENT DOCUMENTS

| | | | | |
|---|---|---|---|---|
| 6,846,725 | B2 * | 1/2005 | Nagarajan et al. | 438/456 |
| 7,153,717 | B2 * | 12/2006 | Carley et al. | 438/55 |
| 7,157,781 | B2 * | 1/2007 | Kawasaki et al. | 257/419 |
| 2003/0215974 | A1 * | 11/2003 | Kawasaki et al. | 438/50 |
| 2006/0110843 | A1 * | 5/2006 | Oguchi | 438/52 |
| 2012/0056281 | A1 * | 3/2012 | Mohanakrishnaswamy et al. | 257/415 |
| 2012/0098074 | A1 * | 4/2012 | Lin et al. | 257/414 |

* cited by examiner

*Primary Examiner* — David Zarneke
(74) *Attorney, Agent, or Firm* — Haynes and Boone, LLP

(57) ABSTRACT

The present disclosure provides a micro-electro-mechanical systems (MEMS) device and a method for fabricating such a device. In an embodiment, a MEMS device includes a substrate, a dielectric layer above the substrate, an etch stop layer above the dielectric layer, and two anchor plugs above the dielectric layer, the two anchor plugs each contacting the etch stop layer or a top metal layer disposed above the dielectric layer. The device further comprises a MEMS structure layer disposed above a cavity formed between the two anchor plugs and above the etch stop layer from release of a sacrificial layer.

20 Claims, 17 Drawing Sheets

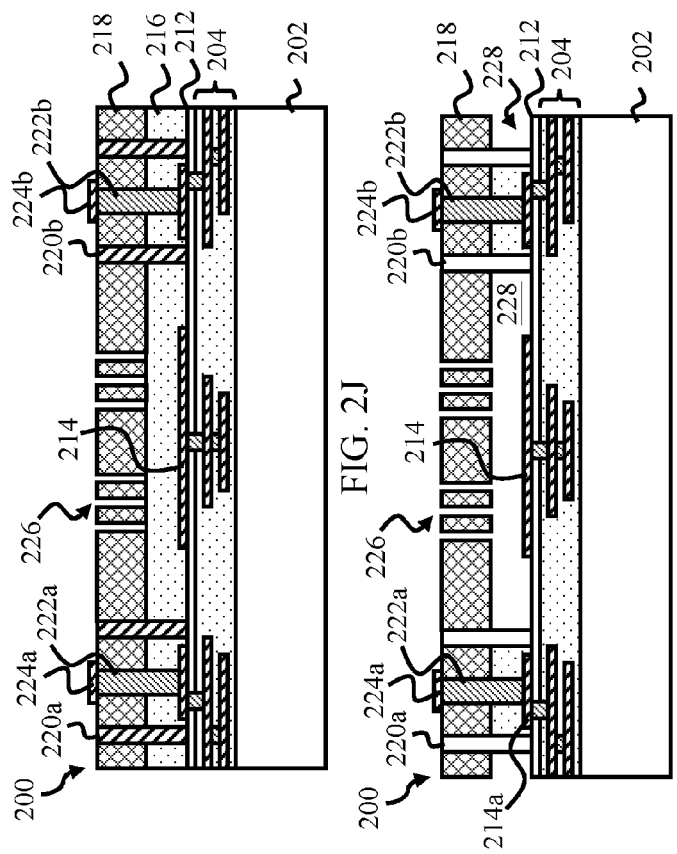
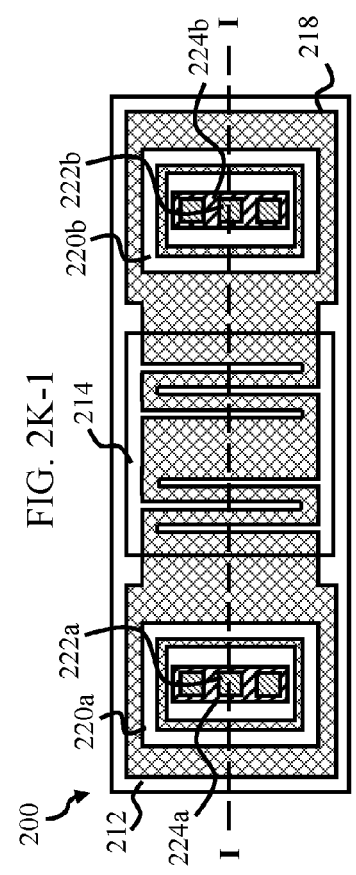

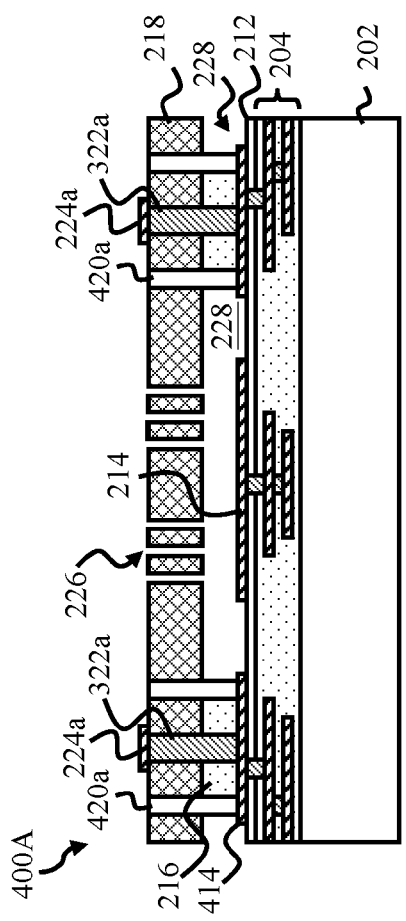
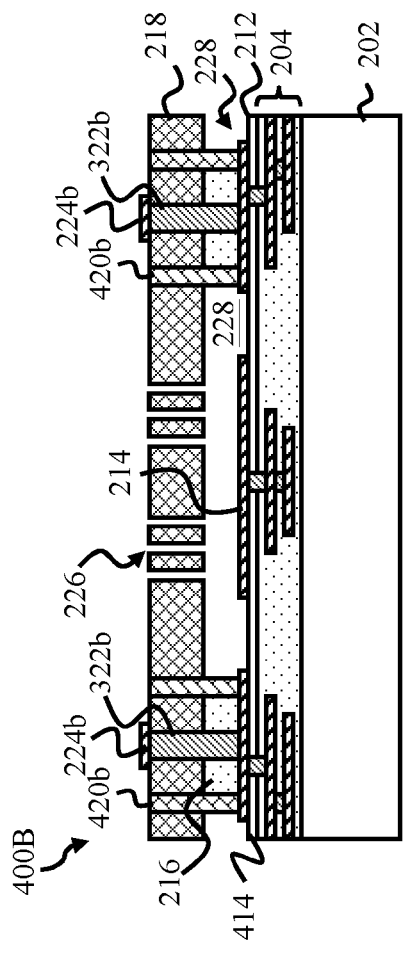
FIG. 4A
FIG. 4B

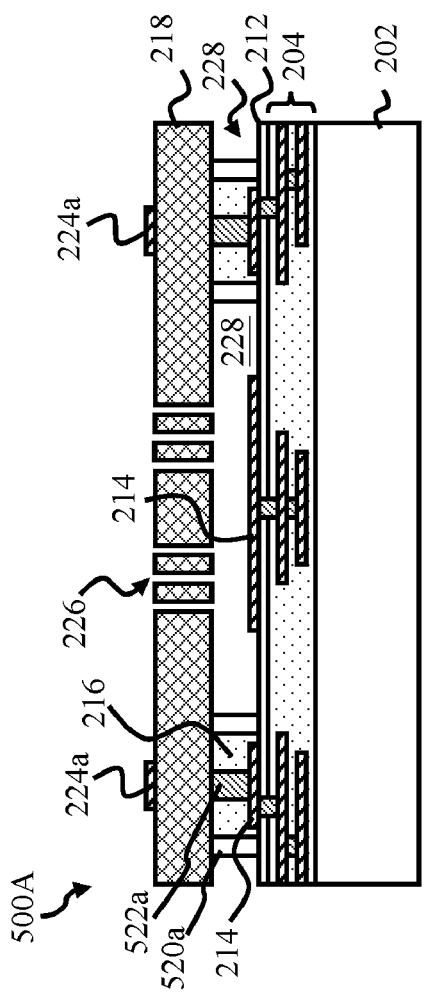
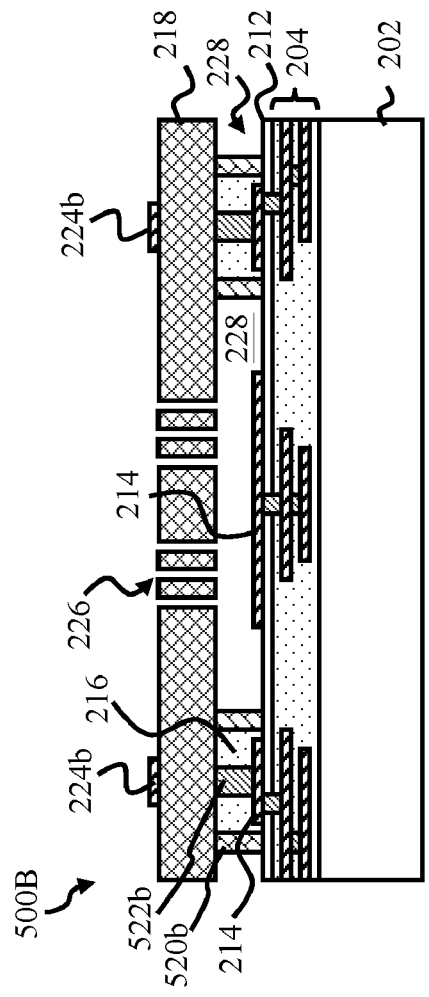
FIG. 5A
FIG. 5B

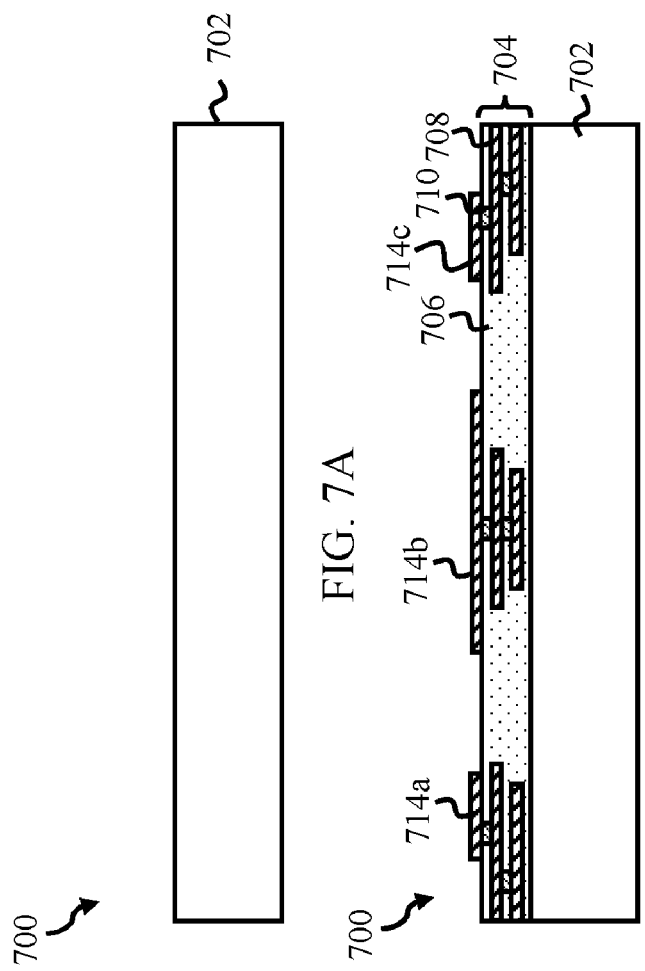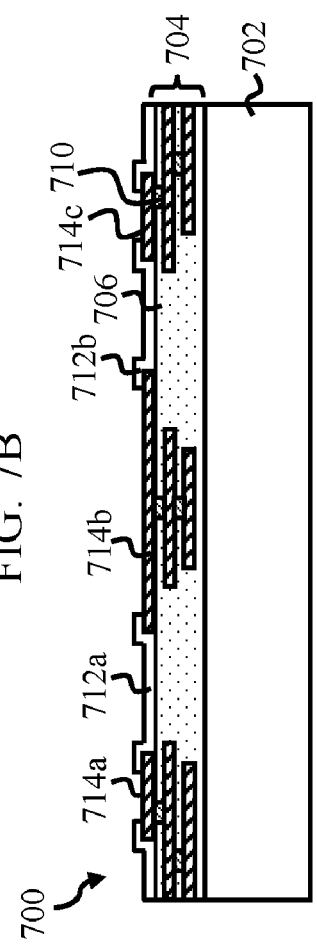
FIG. 7A  FIG. 7B  FIG. 7C

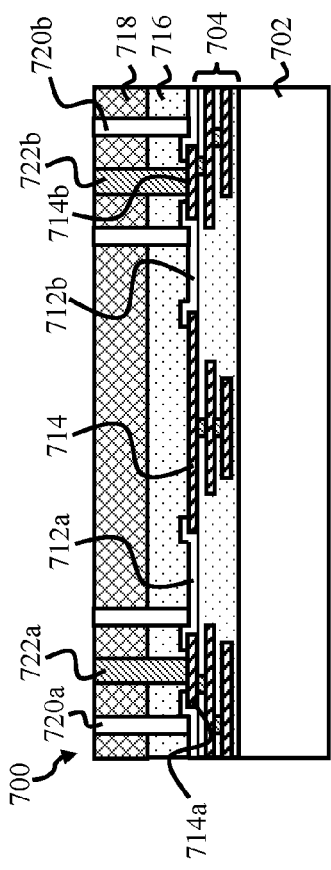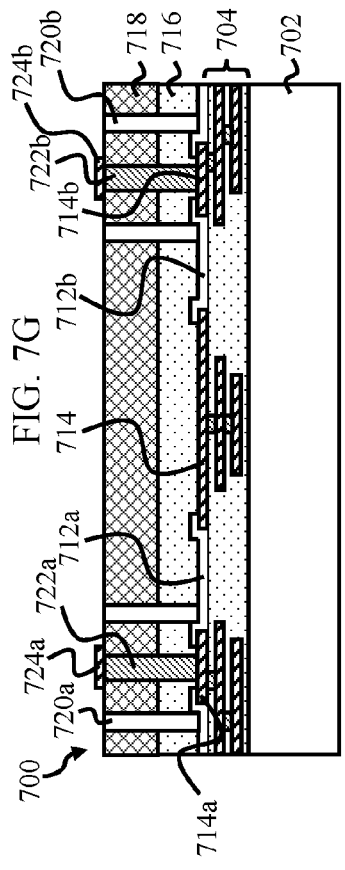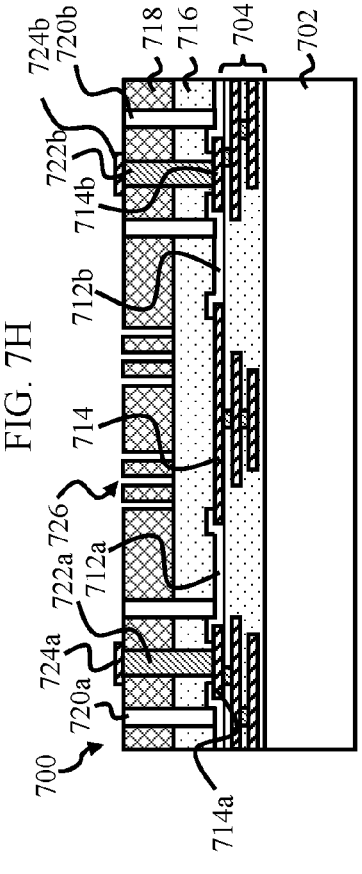

MEMS DEVICE ETCH STOP

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro-electro-mechanical systems (MEMS) for enhancing electrical properties and reducing costs. However, there are several limitations to the current WLP technology and the integration of the wafer fabrication and packaging processes it provides. The methods of packaging (e.g., protecting the device and providing interconnections) may not be compatible with the fabrication processes that are used to form the devices. Furthermore, solutions often require complicated packaging schemes that suffer from area/density penalties, contamination issues, and/or structural weakness. In one example, MEMS devices have suffered from a poor mechanical structure at an anchor area due to the lack of control over etch of the sacrificial layer.

SUMMARY

The present disclosure provides for many different embodiments. According to one embodiment, a micro-electro-mechanical systems (MEMS) device is provided. The device comprises a substrate, a dielectric layer above the substrate, an etch stop layer above the dielectric layer, and two anchor plugs above the dielectric layer, the two anchor plugs each contacting the etch stop layer or a top metal layer disposed above the dielectric layer. The device further comprises a MEMS structure layer disposed above a cavity formed between the two anchor plugs and above the etch stop layer from release of a sacrificial layer.

Another broad embodiment provides for a method of fabricating a MEMS device. The method includes providing a substrate, forming a dielectric layer above the substrate, forming an etch stop layer above the dielectric layer, forming a sacrificial layer above the etch stop layer, forming a micro-electro-mechanical systems (MEMS) structure layer above the sacrificial layer, and forming two anchor plugs above the dielectric layer, the two anchor plugs each contacting the etch stop layer or a top metal layer above the dielectric layer. The method further comprises patterning the MEMS structure layer to form a release aperture, and removing the sacrificial layer between the two anchor plugs and above the etch stop layer through the release aperture of the MEMS structure layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A through 2K-1 are cross-sectional views of a MEMS device at various stages of fabrication in accordance with an embodiment of the present disclosure, and FIG. 2K-2 is a top view of the MEMS device at a stage of fabrication shown in FIG. 2K-1.

FIGS. 3A-6A and 3B-6B are cross-sectional views of MEMS devices with non-conductive and conductive anchor plugs, respectively, in accordance with embodiments of the present disclosure.

FIG. 7A through 7J-1 are cross-sectional views of a MEMS device at various stages of fabrication in accordance with an embodiment of the present disclosure, and FIG. 7J-2 is a top view of the MEMS device at a stage of fabrication shown in FIG. 7J-1.

FIGS. 8A-11A and 8B-11B are cross-sectional views of MEMS devices with non-conductive and conductive anchor plugs, respectively, in accordance with embodiments of the present disclosure.

DETAILED DESCRIPTION

Figure 1:
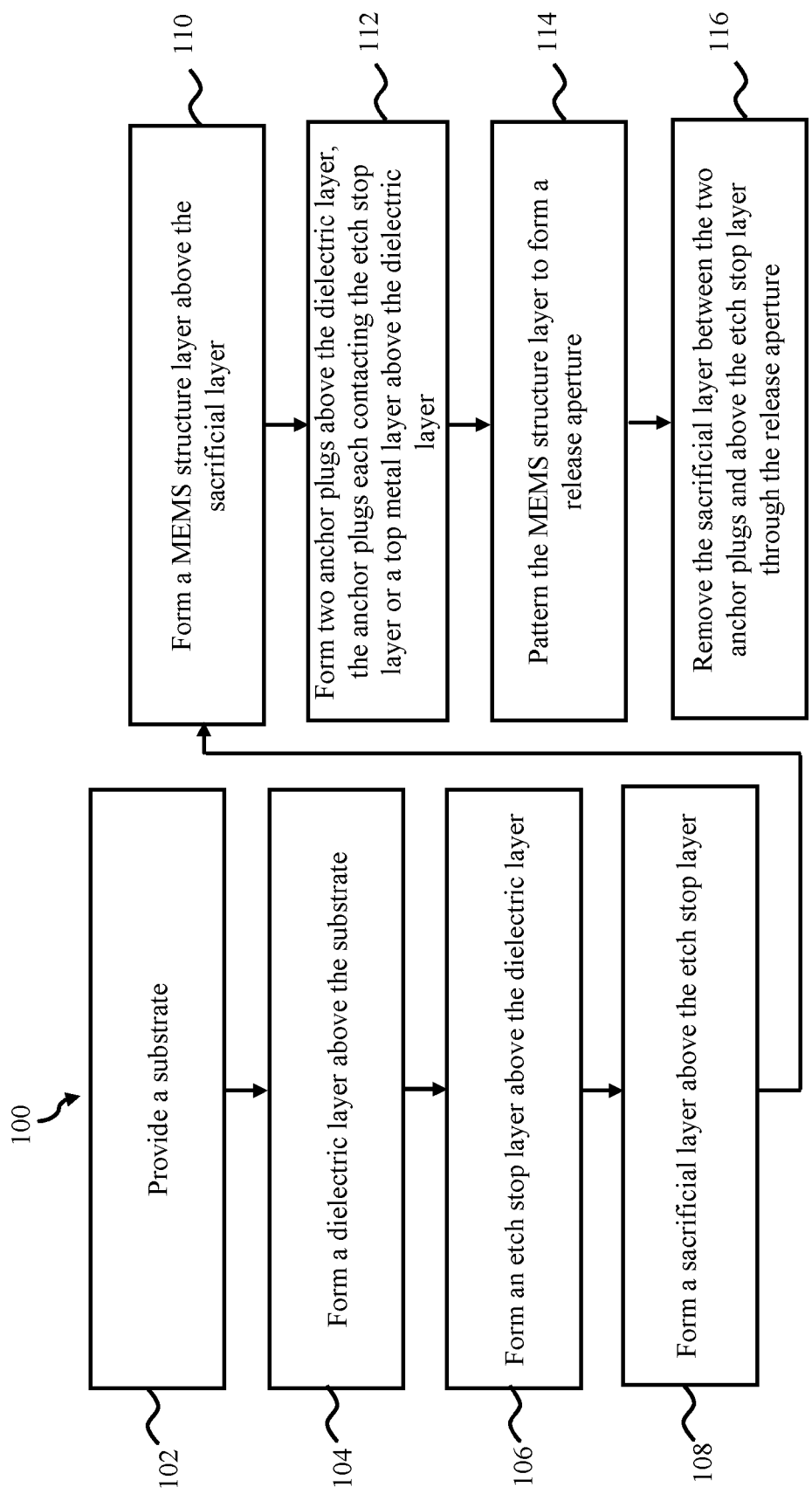
FIG. 1 is a flowchart of a method of fabricating a micro-electro-mechanical systems (MEMS) device in accordance with an embodiment of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure may refer generally to WLP to refer to the packaging of a substrate. The substrates described herein may take various forms including but not limited to wafers (or portions thereof) having integrated circuits including those formed by CMOS-based processes, die, micro-electro-mechanical systems (MEMS) substrates, capping substrates, a single substrate with CMOS devices and MEMS devices formed thereon, and the like. In contrast, a carrier wafer may not include an integrated circuit. Furthermore, as described above, specific embodiments may be described herein which are exemplary only and not intended to be limiting.

Referring now to FIG. 1, a flowchart is shown illustrating a method 100 for fabricating a MEMS device in accordance with an embodiment of the present disclosure. The method 100 begins at block 102 where a substrate is provided. At block 104, a dielectric layer is formed above the substrate. At block 106, an etch stop layer is formed above the dielectric layer. At block 108, a sacrificial layer is formed above the etch stop layer. At block 110, a micro-electro-mechanical systems (MEMS) structure layer is formed above the sacrificial layer. At block 112, two anchor plugs are formed above the dielectric layer, the two anchor plugs each contacting the etch stop layer or a top metal layer above the dielectric layer. At block 114, the MEMS structure layer is patterned to form a release aperture. At block 116, the sacrificial layer between the two anchor plugs and above the etch stop layer is removed through the release aperture of the MEMS structure layer.

It should be noted that the operations of the method 100 may be rearranged or otherwise modified within the scope of the various aspects. It is further noted that additional processes may be provided before, during, and after the method 100 of FIG. 1, and that some other processes may only be briefly described herein. Thus, other implementations are possible with the scope of the various aspects described herein. In one example, the etch stop layer is comprised of a dielectric material or a non-conductive material. In another example, the etch stop layer is resistant to vapor HF, liquid HF, and/or buffered HF. In another example, the etch stop layer is comprised of AlN, SiC, and/or amorphous carbon. In another example, the dielectric layer and the sacrificial layer are each comprised of a same material, such as an oxide. In another example, the anchor plugs are formed through the MEMS structure layer and/or the sacrificial layer. In another example, the anchor plugs are formed of conductive or non-conductive material. In another example, the anchor plugs are comprised of SiGe, polysilicon, tungsten, titanium nitride, and/or aluminum oxide.

In yet another example, the method 100 may further include forming the top metal layer above the etch stop layer, and forming a metal or conductive via through the MEMS structure layer and the sacrificial layer to contact the top metal layer. In yet another example, the method 100 may further include forming the top metal layer in sections above the dielectric layer, and forming the etch stop layer between the sections of the top metal layer.

The substrate may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. The MEMS substrate may be fabricated from a silicon wafer and includes MEMS features and/or functionalities. A substrate having a device (e.g., integrated circuit) formed by other semiconductor fabrication technologies is also within the scope of the described method.

According to one aspect, the substrate of the MEMS structure may include a silicon wafer and may also include other elementary semiconductor, such as germanium, or a compound semiconductor, such as silicon carbide, gallium arsenic, indium arsenide, and/or indium phosphide. The various structures in the method 100 described above may be formed by various deposition, pattern, and etch techniques conventionally known in the art.

Figure 2A:
Figure 7D:
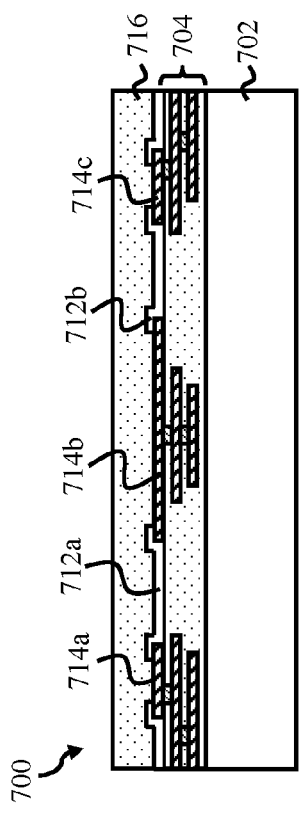
Figure 7E:
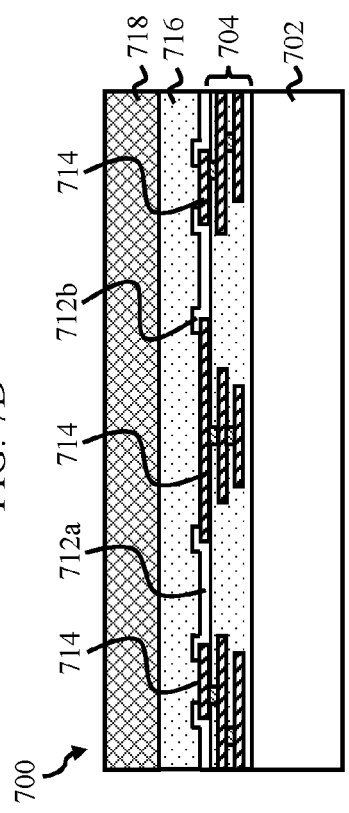
Figure 7F:
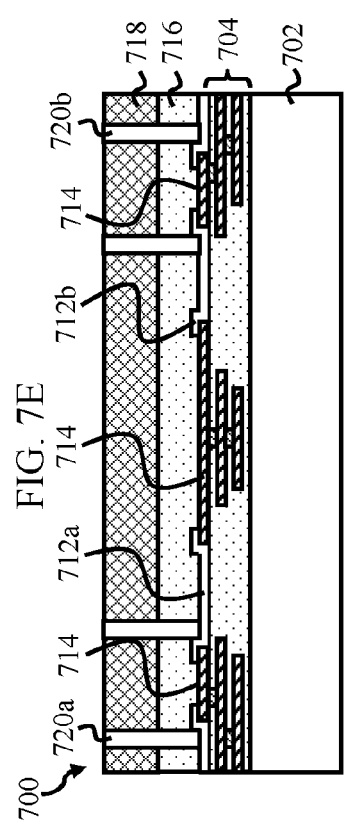
Figures 1, 7J:
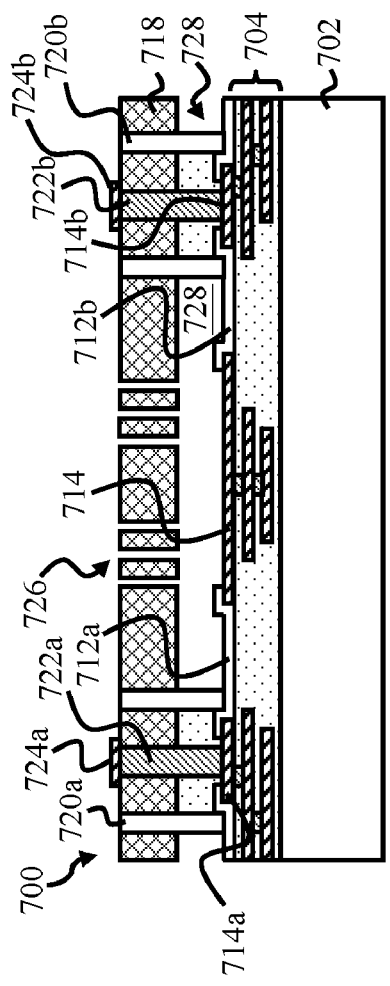
Figures 2, 7J:
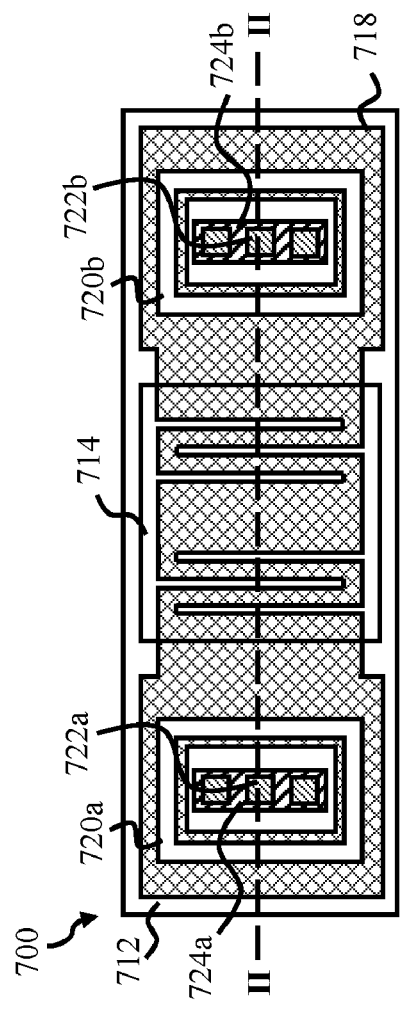

Referring now to FIGS. 2A through 2K-2, FIGS. 2A through 2K-1 are cross-sectional views of a MEMS device 200 at various stages of fabrication in accordance with an embodiment of the present disclosure, and FIG. 2K-2 is a top view of the MEMS device at a stage of fabrication shown in FIG. 2K-1.

FIG. 2A illustrates a substrate 202. In one embodiment, substrate 202 may include a semiconductor substrate, and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

Figure 2B:
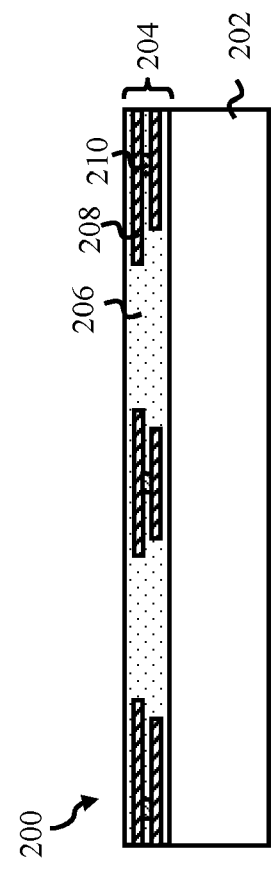

FIG. 2B illustrates a dielectric layer 204 formed above the substrate 202. In one embodiment, dielectric layer 204 includes dielectric layers 206 comprised of a dielectric material, such as an oxide or nitride of a CMOS process, and may further include a plurality of metal layers 208 interconnected by vias 210. Dielectric layers 206, metal layers 208, and vias 210 may be formed by various deposition and etch techniques.

Figure 2C:
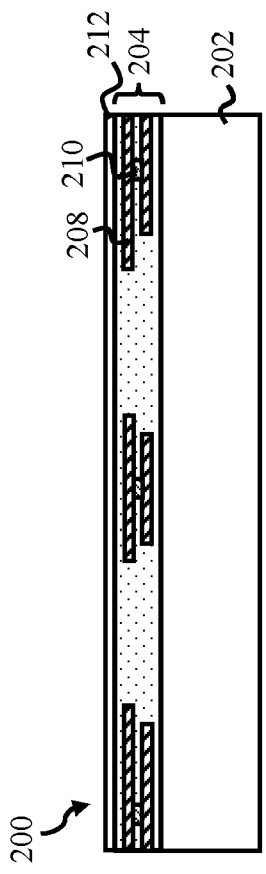

FIG. 2C illustrates an etch stop layer 212 formed above the dielectric layer 204. According to one aspect, etch stop layer 212 is comprised of a dielectric material or a non-conductive material. According to another aspect, etch stop layer 212 is resistant to vapor HF, liquid HF, and/or buffered HF. According to another aspect, etch stop layer 212 is comprised of AlN, SiC, and/or amorphous carbon. According to another aspect, etch stop layer 212 is formed compatible with a CMOS process. Various conventional deposition, pattern, and etch techniques and tools may be used to form etch stop layer 212. Advantageously, etch stop layer 212 controls the vertical etch of a subsequently formed sacrificial layer above the etch stop layer.

Figure 2D:
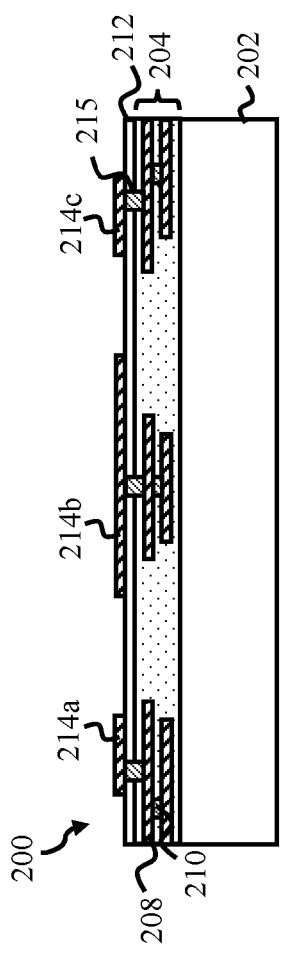

FIG. 2D illustrates a top metal layer 214 (e.g., top metal layers 214a, 214b, 214c) formed above the etch stop layer 212 and respective vias 215 coupling the top metal layer 214 to metal layers 208. Various conventional deposition, pattern, and etch techniques and tools may be used to form top metal layer 214 and vias 215.

Figure 2E:
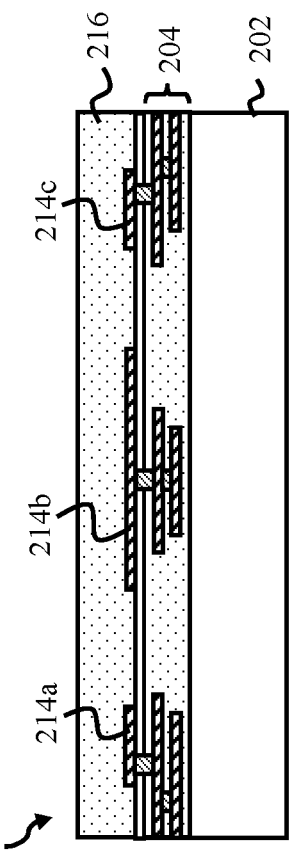

FIG. 2E illustrates a sacrificial layer 216 formed above the top metal layer 214 and the etch stop layer 212. According to one aspect, sacrificial layer 216 is comprised of the same material as dielectric layer 206, such as silicon oxide in one example, but may be comprised of different materials in other embodiments. In one example, sacrificial layer 216 may be comprised of various materials, such as a metal, a polymer, a nitride, an oxide, or a combination thereof, but the sacrificial layer is comprised of a material which is selectively removable from a subsequently formed MEMS structure layer 218, described further below. Sacrificial layer 216 undergoes planarization, such as by chemical mechanical planarization (CMP), to provide for a more robust mechanical structure. According to an aspect, sacrificial layer 216 may be formed by various conventional techniques and tools, such as by chemical vapor deposition (CVD), low pressure CVD (LPCVD), physical vapor deposition (PVD), plating, evaporation, electron beam evaporation (E-gun), ion beam, energy beam, combinations thereof, and/or other suitable deposition processes.

Figure 2F:
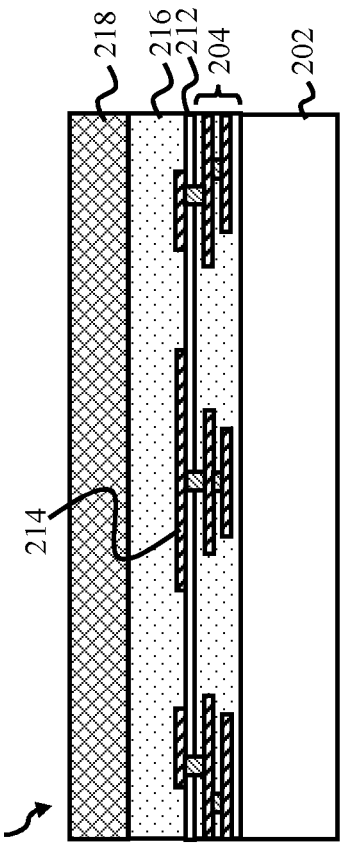

FIG. 2F illustrates a micro-electro-mechanical systems (MEMS) structure layer 218 formed above the sacrificial layer 216. MEMS structure layer 218 may be deposited and planarized in one embodiment, or in another embodiment, MEMS structure layer 218 may be bonded from another wafer. In one aspect, MEMS structure layer 218 may be comprised of various materials but is selective against a subsequent etch of the sacrificial layer 216.

Figure 2G:
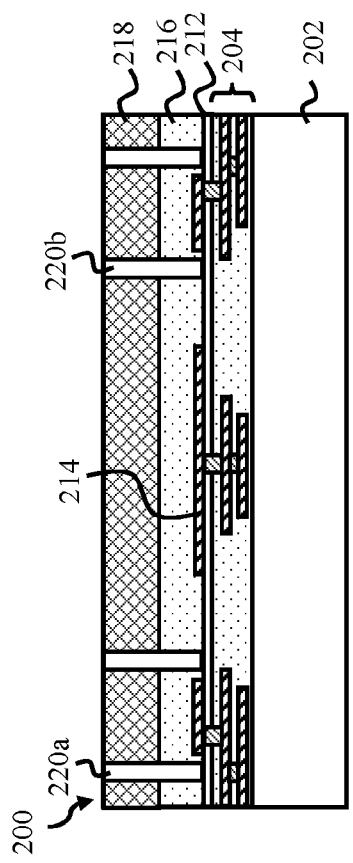

FIG. 2G illustrates two anchor plugs 220 (e.g., anchor plugs 220a, 220b) formed above the dielectric layer 204. In this embodiment, the two anchor plugs 220 each contact the etch stop layer 212. In other embodiments, the anchor plugs 220 each contact a top metal layer above the dielectric layer 204, as will be further described below with respect to FIGS. 4A-4B, 6A-6B, 9A-9B, and 11A-11B. According to one aspect, the anchor plugs 220 are each disposed through the MEMS structure layer 218 and the sacrificial layer 216. According to another aspect, the anchor plugs 220 may be formed prior to the MEMS structure layer 218 and may be disposed through the sacrificial layer 216 (e.g., as shown and described below with respect to FIGS. 5A-5B, 6A-6B, 10A-10B, and 11A-11B). Thus, according to an aspect, the anchor plugs 220 may each be disposed through the MEMS structure layer 218 and/or the sacrificial layer 216. According to another aspect, the anchor plugs 220 are each comprised of conductive or non-conductive material. According to yet another aspect, the anchor plugs 220 are each comprised of SiGe, polysilicon, tungsten, titanium nitride, and/or aluminum oxide. According to yet another aspect, anchor plugs 220 are not restricted to a single material but may be comprised of a multi-film stack. According to yet another aspect, anchor plugs 220 are formed in a deposition process under about 450 degrees Celsius. According to yet another aspect, anchor plugs 220 may be formed by lithography, an etch through MEMS structure layer 218 and sacrificial layer 216, deposition of the anchor plug material, and an etch back.

Figure 2H:
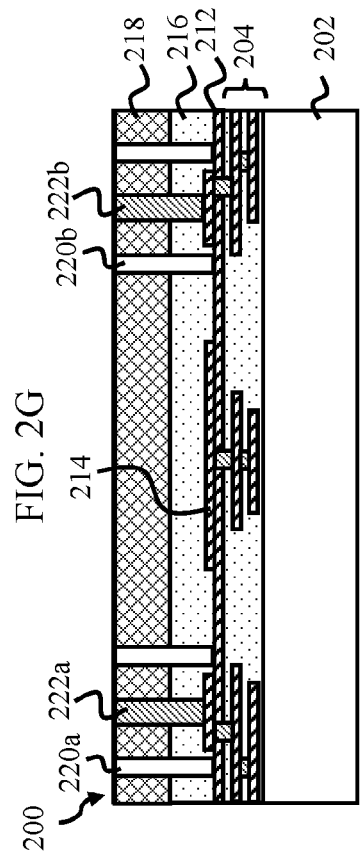

FIG. 2H illustrates a via 222 (e.g., vias 222a, 222b) formed through MEMS structure layer 218 and sacrificial layer 216 to contact top metal layer 214. According to one aspect, via 222 may be comprised of conductive material. According to one aspect, via 222 may be disposed through the MEMS structure layer 218 and sacrificial layer 216 to contact the top metal layer 214. In other embodiments, via 222 may be formed prior to the MEMS structure layer 218 and thus via 222 may be disposed through sacrificial layer 216 to contact the top metal layer 214.

Figure 2I:
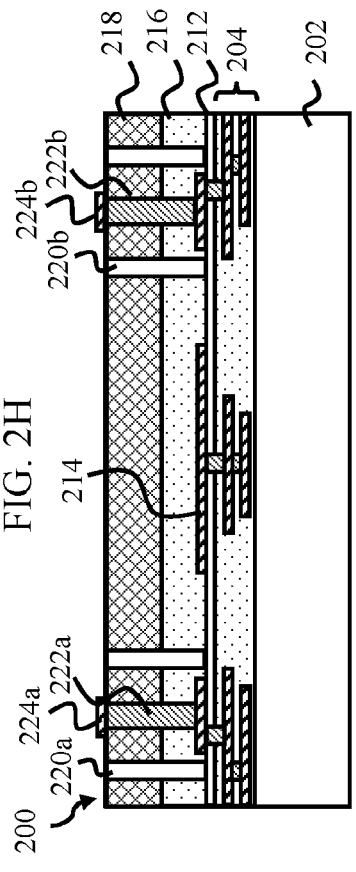

FIG. 2I illustrates a metal pad 224 (e.g., pads 224a, 224b) formed above a respective via 222 (e.g., vias 222a, 222b). Other materials and layers may be deposited and patterned according to requirements of the MEMS device. Various conventional deposition, pattern, and etch techniques and tools may be used to form metal pads 224, which may be formed of various metals.

FIG. 2J illustrates the MEMS structure layer 218 patterned to form a release aperture 226. MEMS structure layer 218 may be patterned by various lithography and etch techniques. More or less openings than those illustrated in FIG. 2J are within the scope of the present disclosure. Various conventional pattern and etch techniques and tools may be used for the patterned etch of the MEMS structure layer 218. In one example, an isotropic oxide etcher with a fluorinated etchant gas may be used in conjunction with a patterned photoresist for the patterned etch. In another example, deep reactive-ion etching may be used to form openings 226. Other manufacturing techniques used to pattern the substrate may include photolithography processing and/or etching to pattern the substrate.

FIG. 2K-1 is a sectional view taken along line I-I of FIG. 2K-2. FIG. 2K-1 and 2K-2 illustrate a sectional view and a top view, respectively, of MEMS device 200 with the sacrificial layer 216 between the two anchor plugs 220a, 220b and above the etch stop layer 212 removed through the release aperture 226 of the MEMS structure layer 218. According to one aspect, the sacrificial layer 216 may be removed by a selective etch, such as by a vapor HF etch.

Advantageously, MEMS structure layer 218 is formed above cavity 228 between anchor plugs 220 and above etch stop layer 212 with improved mechanical strength and protection of underlying dielectric material, as anchor plugs 220 and etch stop layer 212 function to control etch removal of the sacrificial layer in both horizontal (transverse or lateral) and vertical directions, respectively. In other words, a dielectric layer underneath etch stop layer 212 is protected from damage during an etch process of the sacrificial layer by etch stop layer 212, and the anchor area of the MEMS structure layer 218 (i.e., the area of MEMS structure layer 218 coupled to dielectric layer 204 and substrate 202) is protected from damage during an etch process of the sacrificial layer by anchor plugs 220, thereby improving the mechanical strength at the anchor area. Furthermore, the present disclosure provides for monolithic integration of MEMS and CMOS with an oxide sacrificial layer.

Referring now to FIGS. 3A-6A and 3B-6B, cross-sectional views are illustrated of MEMS devices with non-conductive and conductive anchor plugs, respectively, in accordance with embodiments of the present disclosure. FIGS. 3A-6A and 3B-6B illustrate MEMS devices which are similar to the MEMS device 200 illustrated in FIG. 2K-1, and may include the same or substantially similar elements as in MEMS device 200 as described above with respect to FIGS. 2A through 2K-1. Descriptions of the same or substantially similar elements may not be included here to avoid prolix description although such descriptions are fully applicable in these embodiments with respect to FIGS. 3A-6A and 3B-6B. The figures are shown juxtaposed with one another to highlight different embodiments of the present disclosure.

Figure 3A:
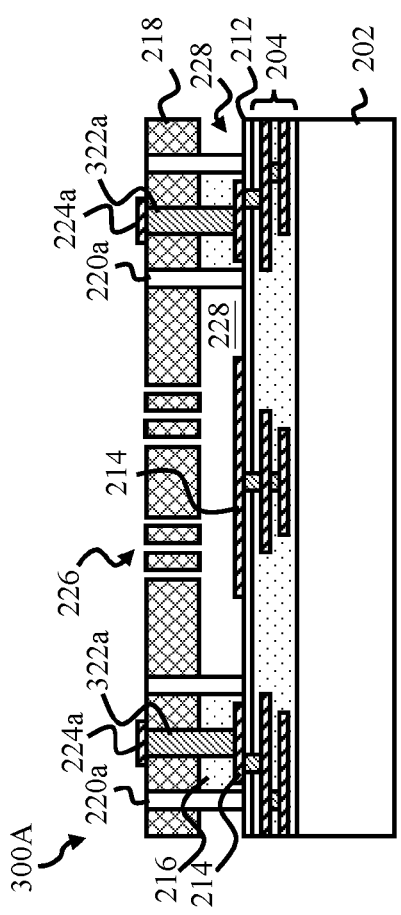
Figure 3B:
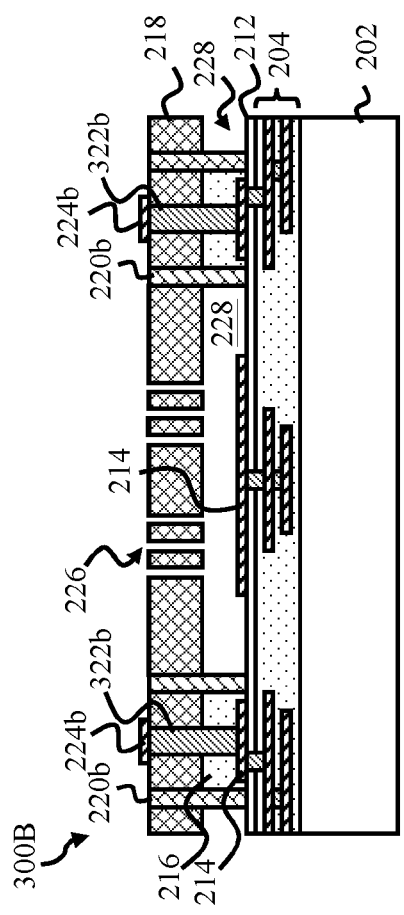

FIG. 3A illustrates a MEMS device 300A including a conductive via 322a formed through MEMS structure layer 218 and sacrificial layer 216 to contact top metal layer 214. Non-conductive anchor plugs 220a are formed through MEMS structure layer 218 and sacrificial layer 216 to contact etch stop layer 212. Conductive via 322a may be formed in a via formation process (e.g., etch and deposition process) separate from the anchor plug formation process. In contrast, FIG. 3B illustrates a MEMS device 300B including a conductive via 322b which may be formed during the same process as conductive anchor plug 220b formation process. In this case, an additional via plug process is not required.

FIG. 4A illustrates a MEMS device 400A including a conductive via 322a formed through MEMS structure layer 218 and sacrificial layer 216 to contact a top metal layer 414, which in this embodiment has a wider dimension than top metal layer 214 (FIGS. 3A-3B), such that non-conductive anchor plugs 420a are formed through MEMS structure layer 218 and sacrificial layer 216 to contact top metal layer 414 instead of etch stop layer 212. Conductive via 322a may be formed in a via formation process (e.g., deposition process) separate from the anchor plug formation process. In contrast, FIG. 4B illustrates a MEMS device 400B including a conductive via 322b which may be formed in a same process as the conductive anchor plug 420b formation process. In this case, an additional via plug process is not required.

FIG. 5A illustrates a MEMS device 500A including a conductive via 522a formed prior to formation of MEMS structure layer 218, such that conductive via 522a is formed through sacrificial layer 216 to contact top metal layer 214. Non-conductive anchor plugs 520a are also formed prior to formation of MEMS structure layer 218, such that anchor plugs 520 are formed through sacrificial layer 216 to contact etch stop layer 212. Conductive via 522a may be formed in a via formation process (e.g., deposition process) separate from the non-conductive anchor plug formation process. In contrast, FIG. 5B illustrates a MEMS device 500B including a conductive via 522b, which may be formed in a same process as the conductive anchor plug 520b formation process. In this case, an additional via plug process is not required.

Figure 6A:
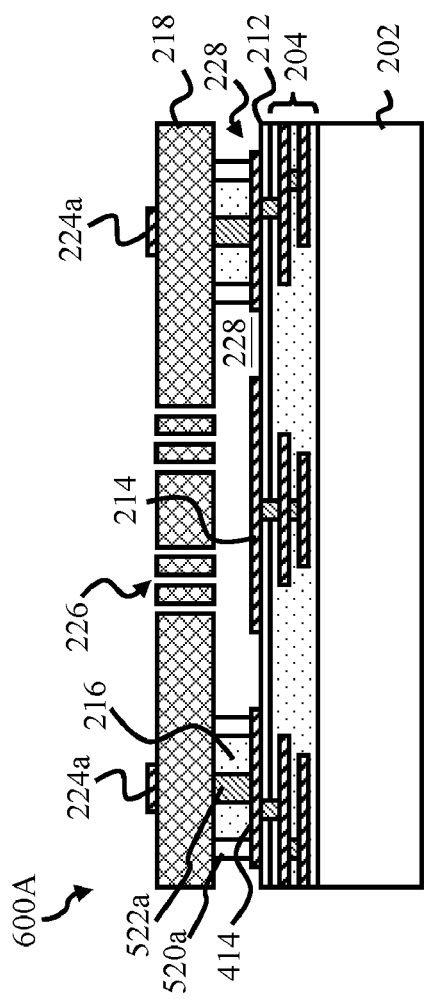
Figure 6B:
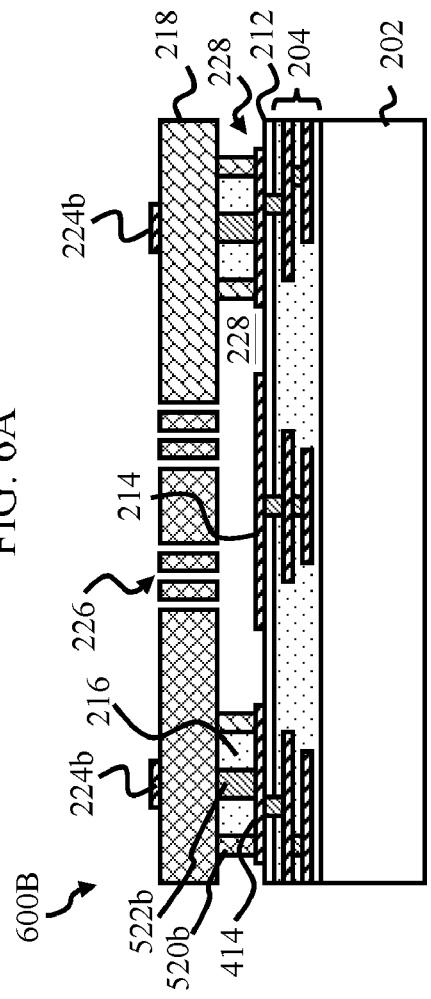

FIG. 6A illustrates a MEMS device 600A including a conductive via 522a formed prior to formation of MEMS structure layer 218, such that conductive via 522a is formed through sacrificial layer 216 to contact a top metal layer 414, which in this embodiment has a wider dimension than top metal layer 214 (FIGS. 5A-5B). Non-conductive anchor plugs 520a, which are also formed prior to formation of MEMS structure layer 218, are formed through sacrificial layer 216 to contact top metal layer 414 instead of etch stop layer 212. Conductive via 522a may be formed in a via formation process (e.g., deposition process) separate from the anchor plug formation process. In contrast, FIG. 6B illustrates a MEMS device 600B including a conductive via 522b which may be formed in a same process as the conductive anchor plug 520b formation process. In this case, an additional via plug process is not required.

Referring now to FIGS. 7A through 7K-2, FIGS. 7A through 7K-1 are cross-sectional views of a MEMS device 700 at various stages of fabrication in accordance with an embodiment of the present disclosure, and FIG. 7K-2 is a top view of the MEMS device at a stage of fabrication shown in FIG. 7K-1.

FIG. 7A illustrates a substrate 702. In one embodiment, substrate 702 may include a semiconductor substrate, and may be comprised of silicon, or alternatively may include silicon germanium, gallium arsenic, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

FIG. 7B illustrates a dielectric layer 704 formed above the substrate 702. In one embodiment, dielectric layer 704 includes dielectric layers 706 comprised of a dielectric material, such as an oxide or nitride of a CMOS process, and may further include a plurality of metal layers 708 interconnected by vias 710. Dielectric layers 706, metal layers 708, and vias 710 may be formed by various deposition and etch techniques.

FIG. 7B further illustrates a top metal layer 714 (e.g., top metal layers 714a, 714b, 714c) formed in sections above dielectric layer 704 and respective vias 710 coupling the top metal layer 714 sections to metal layers 708. Various conventional deposition, pattern, and etch techniques and tools may be used to form top metal layer 714.

FIG. 7C illustrates an etch stop layer 712 (e.g., etch stop layer 712a, 712b) formed above the dielectric layer 704 and between sections of top metal layer 714. According to one aspect, etch stop layer 712 covers the ends of the top metal layer 714 sections. According to one aspect, etch stop layer 712 is comprised of a dielectric material or a non-conductive material. According to another aspect, etch stop layer 712 is resistant to vapor HF, liquid HF, and/or buffered HF. According to another aspect, etch stop layer 712 is comprised of AlN, SiC, and/or amorphous carbon. According to another aspect, etch stop layer 712 is formed compatible with a CMOS process. Various conventional deposition, pattern, and etch techniques and tools may be used to form etch stop layer 712. Advantageously, both etch stop layer 712 and top metal layer 714 control the vertical etch of a subsequently formed sacrificial layer above the etch stop layer 712 and top metal layer 714.

FIG. 7D illustrates a sacrificial layer 716 formed above the top metal layer 714 and the etch stop layer 712. According to one aspect, sacrificial layer 716 is comprised of the same material as dielectric layer 706, such as silicon oxide in one example, but may be comprised of different materials in other embodiments. In one example, sacrificial layer 716 may be comprised of various materials, such as a metal, a polymer, a nitride, an oxide, or a combination thereof, but the sacrificial layer is comprised of a material which is selectively removable from a subsequently formed MEMS structure layer 718, described further below. Sacrificial layer 716 undergoes planarization, such as by chemical mechanical planarization (CMP), to provide for a more robust mechanical structure. According to an aspect, sacrificial layer 716 may be formed by various conventional techniques and tools, such as by chemical vapor deposition (CVD), low pressure CVD (LPCVD), physical vapor deposition (PVD), plating, evaporation, electron beam evaporation (E-gun), ion beam, energy beam, combinations thereof, and/or other suitable deposition processes.

FIG. 7E illustrates a micro-electro-mechanical systems (MEMS) structure layer 718 formed above the sacrificial layer 716. MEMS structure layer 718 may be deposited and planarized in one embodiment, or in another embodiment, MEMS structure layer 718 may be bonded from another wafer. In one aspect, MEMS structure layer 718 may be comprised of various materials but is selective against a subsequent etch of the sacrificial layer 716.

FIG. 7F illustrates two anchor plugs 720 (e.g., anchor plugs 720a, 720b) formed above the dielectric layer 704. In this embodiment, the two anchor plugs 720 each contact the etch stop layer 712. In other embodiments, the anchor plugs 720 each contact a top metal layer above the dielectric layer 704, as will be further described below with respect to FIGS. 9A-9B and 11A-11B. According to one aspect, the anchor plugs 720 are each disposed through the MEMS structure layer 718 and the sacrificial layer 716. According to another aspect, the anchor plugs 720 may be formed prior to the MEMS structure layer 718 and may be disposed through the sacrificial layer 716 (e.g., as shown and described below with respect to FIGS. 10A-10B and 11A-11B). Thus, according to an aspect, the anchor plugs 720 may each be disposed through the MEMS structure layer 718 and/or the sacrificial layer 716. According to another aspect, the anchor plugs 720 are each comprised of conductive or non-conductive material. According to yet another aspect, the anchor plugs 720 are each comprised of SiGe, polysilicon, tungsten, titanium nitride, and/or aluminum oxide. According to yet another aspect, anchor plugs 720 are not restricted to a single material but may be comprised of a multi-film stack. According to yet another aspect, anchor plugs 720 are formed in a deposition process under about 450 degrees Celsius. According to yet another aspect, anchor plugs 720 may be formed by lithography, an etch through MEMS structure layer 718 and sacrificial layer 716, deposition of the anchor plug material, and an etch back.

FIG. 7G illustrates a via 722 (e.g., vias 722a, 722b) formed through MEMS structure layer 718 and sacrificial layer 716 to contact top metal layer 714. According to one aspect, via 722 may be comprised of conductive material. According to one aspect, via 722 may be disposed through the MEMS structure layer 718 and sacrificial layer 716 to contact the top metal layer 714. In other embodiments, via 722 may be formed prior to the MEMS structure layer 718 and thus via 722 may be disposed through sacrificial layer 716 to contact the top metal layer 714.

FIG. 7H illustrates a metal pad 724 (e.g., pads 724a, 724b) formed above a respective via 722 (e.g., vias 722a, 722b). Other materials and layers may be deposited and patterned according to requirements of the MEMS device. Various conventional deposition, pattern, and etch techniques and tools may be used to form metal pads 724, which may be formed of various metals.

FIG. 7I illustrates the MEMS structure layer 718 patterned to form a release aperture 726. MEMS structure layer 718 may be patterned by various lithography and etch techniques. More or less openings than those illustrated in FIG. 7I are within the scope of the present disclosure. Various conventional pattern and etch techniques and tools may be used for the patterned etch of the MEMS structure layer 718. In one example, an isotropic oxide etcher with a fluorinated etchant gas may be used in conjunction with a patterned photoresist for the patterned etch. In another example, deep reactive-ion etching may be used to form openings 726. Other manufacturing techniques used to pattern the substrate may include photolithography processing and/or etching to pattern the substrate.

FIG. 7J-1 is a sectional view taken along line II-II of FIG. 7J-2. FIG. 7J-1 and 7J-2 illustrate a sectional view and a top view, respectively, of MEMS device 700 with the sacrificial layer 716 between the two anchor plugs 720a, 720b and above the etch stop layer 712 and top metal layer 714 removed through the release aperture 726 of the MEMS structure layer 718. According to one aspect, the sacrificial layer 716 may be removed by a selective etch, such as by a vapor HF etch.

Advantageously, MEMS structure layer 718 is formed above cavity 728 disposed between anchor plugs 720 and above etch stop layer 712 and top metal layer 714, with improved mechanical strength and protection of underlying dielectric material, as anchor plugs 720 and etch stop layer 712 function to control etch removal of the sacrificial layer in both horizontal (transverse or lateral) and vertical directions, respectively. In other words, a dielectric layer underneath etch stop layer 712 and top metal layer 714 is protected from damage during an etch process of the sacrificial layer by etch stop layer 712 and metal layer 714, and the anchor area of the MEMS structure layer 718 (i.e., the area of MEMS structure layer 718 coupled to dielectric layer 704 and substrate 702) is protected from damage during an etch process of the sacrificial layer by anchor plugs 720, thereby improving the mechanical strength at the anchor area. Furthermore, the present disclosure provides for monolithic integration of MEMS and CMOS with an oxide sacrificial layer.

Referring now to FIGS. 8A-11A and 8B-11B, cross-sectional views are illustrated of MEMS devices with non-conductive and conductive anchor plugs, respectively, in accordance with embodiments of the present disclosure. FIGS. 8A-11A and 8B-11B illustrate MEMS devices which are similar to the MEMS device 700 illustrated in FIG. 7J-1, and may include the same or substantially similar elements as in MEMS device 700 as described above with respect to FIGS. 7A through 7J-2. Descriptions of the same or substantially similar elements may not be included here to avoid prolix description although such descriptions are fully applicable in these embodiments with respect to FIGS. 8A-11A and 8B-11B. The figures are shown juxtaposed with one another to highlight different embodiments of the present disclosure.

Figure 8A:
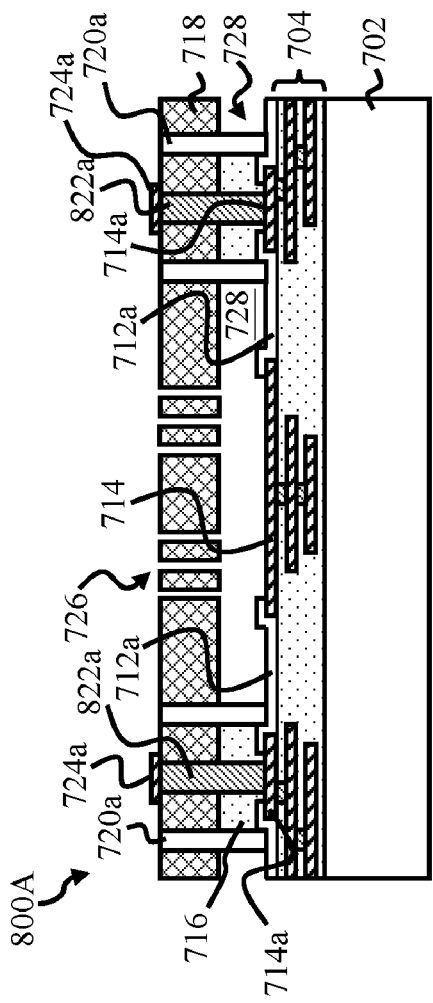
Figure 8B:
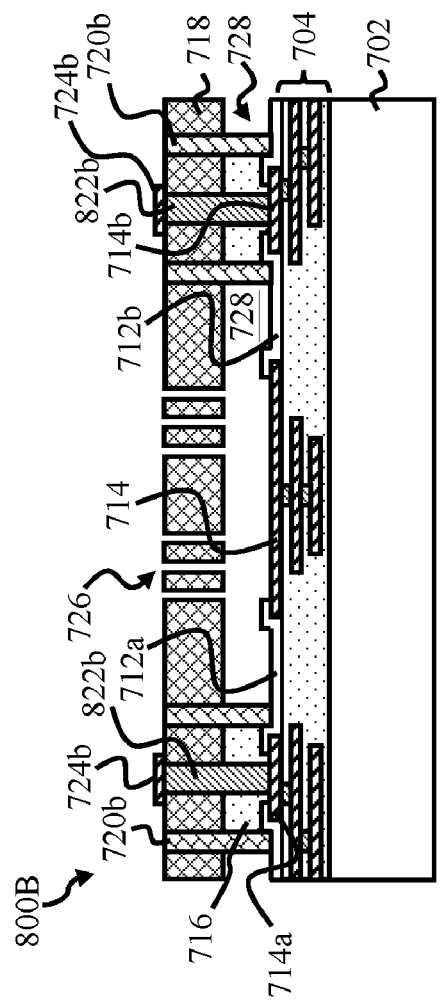

FIG. 8A illustrates a MEMS device 800A including a conductive via 822a formed through MEMS structure layer 718 and sacrificial layer 716 to contact top metal layer 714. Non-conductive anchor plugs 720a are formed through MEMS structure layer 718 and sacrificial layer 716 to contact etch stop layer 712. Conductive via 822a may be formed in a via formation process (e.g., etch and deposition process) separate from the anchor plug formation process. In contrast, FIG. 8B illustrates a MEMS device 800B including a conductive via 822b which may be formed during the same process as the conductive anchor plug 720b formation process. In this case, an additional via plug process is not required.

Figure 9A:
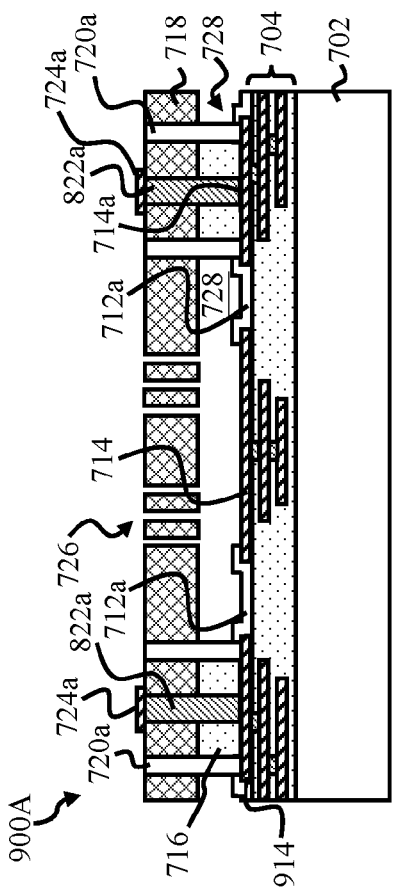
Figure 9B:
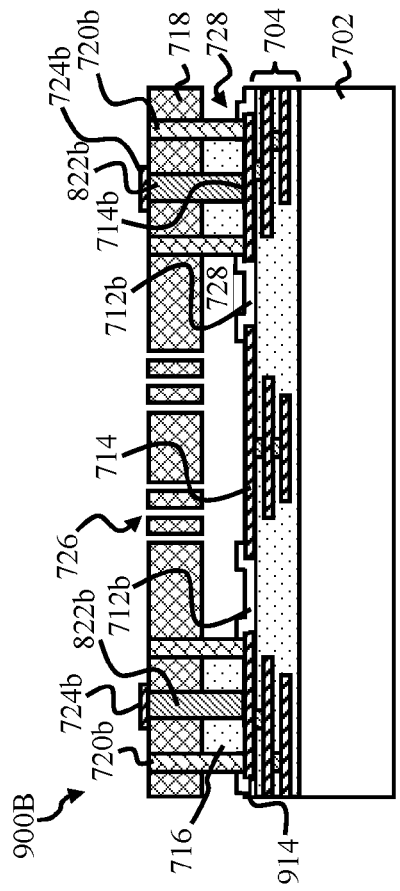

FIG. 9A illustrates a MEMS device 900A including a conductive via 822a formed through MEMS structure layer 718 and sacrificial layer 716 to contact a top metal layer 914, which in this embodiment has a wider dimension than top metal layer 714 (FIGS. 8A-8B), such that non-conductive anchor plugs 720a are formed through MEMS structure layer 718 and sacrificial layer 716 to contact top metal layer 914 instead of etch stop layer 712. Conductive via 822a may be formed in a via formation process (e.g., deposition process) separate from the anchor plug formation process. In contrast, FIG. 9B illustrates a MEMS device 900B including a conductive via 822b which may be formed in a same process as the conductive anchor plug 720b formation process. In this case, an additional via plug process is not required.

Figure 10A:
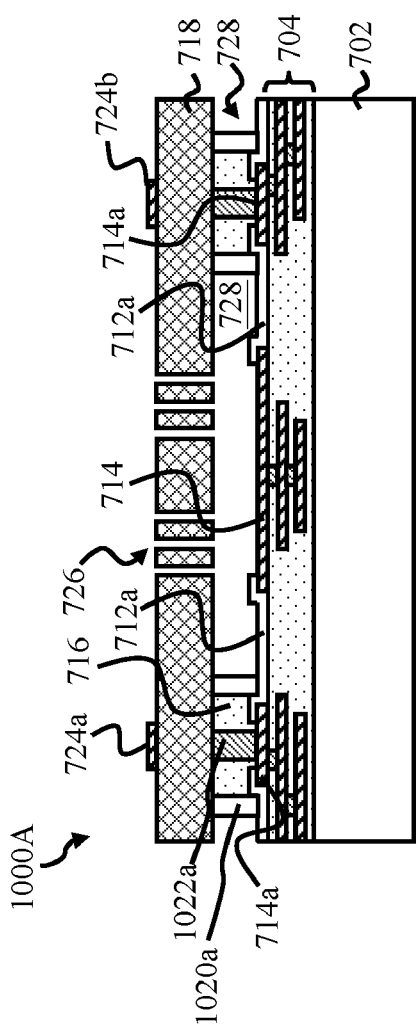
Figure 10B:
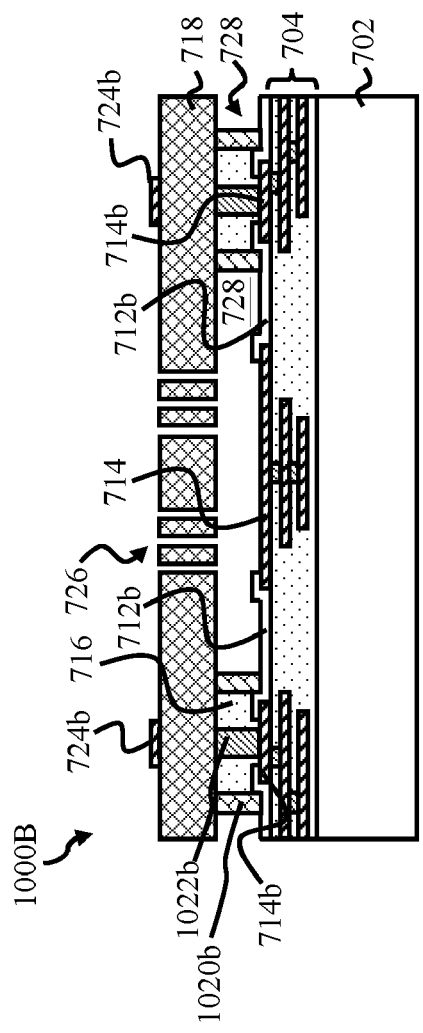

FIG. 10A illustrates a MEMS device 1000A including a conductive via 1022a formed prior to formation of MEMS structure layer 718, such that conductive via 1022a is formed through sacrificial layer 716 to contact top metal layer 714. Non-conductive anchor plugs 1020a are also formed prior to formation of MEMS structure layer 718, such that anchor plugs 1020a are formed through sacrificial layer 716 to contact etch stop layer 712. Conductive via 1022a may be formed in a via formation process (e.g., deposition process) separate from the anchor plug formation process. In contrast, FIG. 10B illustrates a MEMS device 1000B including a conductive via 1022b, which may be formed in a same process as the conductive anchor plug 1020b formation process. In this case, an additional via plug process is not required.

Figure 11A:
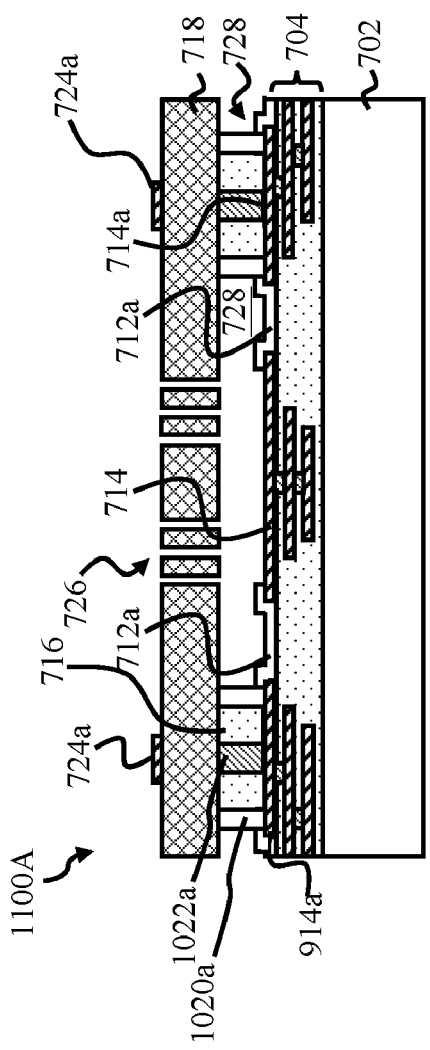
Figure 11B:
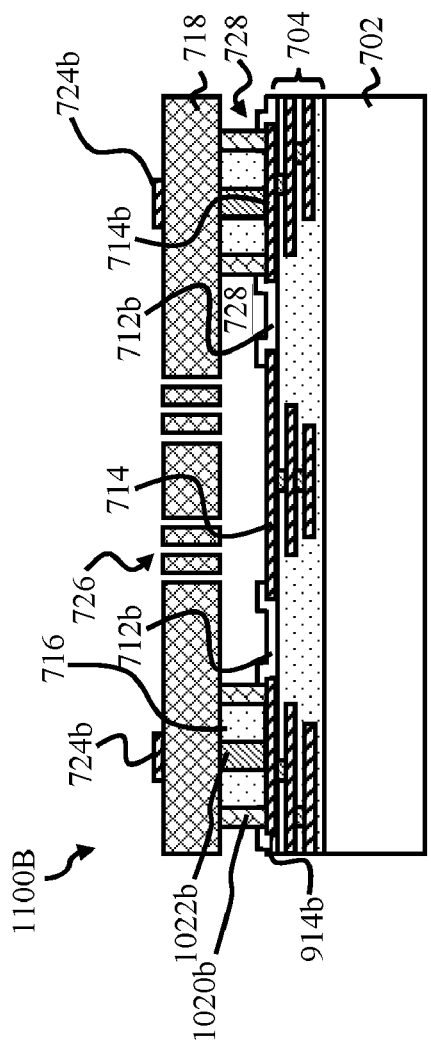

FIG. 11A illustrates a MEMS device 1100A including a conductive via 1022a formed prior to formation of MEMS structure layer 718, such that conductive via 1022a is formed through sacrificial layer 716 to contact a top metal layer 914, which in this embodiment has a wider dimension than top metal layer 714 (FIGS. 10A-10B). Non-conductive anchor plugs 1020a, which are also formed prior to formation of MEMS structure layer 718, are formed through sacrificial layer 716 to contact top metal layer 914 instead of etch stop layer 712. Non-conductive via 1022a may be formed in a via formation process (e.g., deposition process) separate from the anchor plug formation process. In contrast, FIG. 11B illustrates a MEMS device 1100B including a conductive via 1022b which may be formed in a same process as the conductive anchor plug 1020b formation process. In this case, an additional via plug process is not required.

Advantageously, the fabrication methods and MEMS devices described above may be easily integrated with standard CMOS backend bump, packaging, and testing processes. Furthermore, the present disclosure allows for a simplified MEMS packaging process that provides for both horizontal etch control and vertical etch control with the use of anchor plugs and an etch stop layer bounding a sacrificial layer.

Thus, the present disclosure provides for various embodiments. In one embodiment, a semiconductor device is disclosed. A MEMS device includes a substrate, a dielectric layer above the substrate, an etch stop layer above the dielectric layer, and two anchor plugs above the dielectric layer, the two anchor plugs each contacting the etch stop layer or a top metal layer disposed above the dielectric layer. The device further comprises a MEMS structure layer disposed above a cavity formed between the two anchor plugs and above the etch stop layer from release of a sacrificial layer.

The present disclosure also provides for a method of fabricating a MEMS device. In one embodiment, the method includes providing a substrate, forming a dielectric layer above the substrate, forming an etch stop layer above the dielectric layer, forming a sacrificial layer above the etch stop layer, forming a micro-electro-mechanical systems (MEMS) structure layer above the sacrificial layer, and forming two anchor plugs above the dielectric layer, the two anchor plugs each contacting the etch stop layer or a top metal layer above the dielectric layer. The method further comprises patterning the MEMS structure layer to form a release aperture, and removing the sacrificial layer between the two anchor plugs and above the etch stop layer through the release aperture of the MEMS structure layer.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A micro-electro-mechanical systems (MEMS) device, comprising:
   a substrate;
   a dielectric layer above the substrate;
   an etch stop layer above the dielectric layer;
   two anchor plugs above the dielectric layer, the two anchor plugs each contacting the etch stop layer or a top metal layer disposed above the dielectric layer; and
   a micro-electro-mechanical systems (MEMS) structure layer disposed above a cavity formed between and adjacent to the two anchor plugs and above the etch stop layer from release of a sacrificial layer.

2. The device of claim 1, wherein the etch stop layer is comprised of a dielectric material or a non-conductive material.

3. The device of claim 1, wherein the etch stop layer is resistant to vapor HF, liquid HF, and/or buffered HF.

4. The device of claim 1, wherein the etch stop layer is comprised of AlN, SiC, and/or amorphous carbon.

5. The device of claim 1, wherein the dielectric layer and the sacrificial layer are each comprised of a same material.

6. The device of claim 1, wherein the anchor plugs are disposed through the MEMS structure layer and/or the sacrificial layer.

7. The device of claim 1, wherein the anchor plugs are comprised of conductive or non-conductive material.

8. The device of claim 1, wherein the anchor plugs are comprised of SiGe, polysilicon, tungsten, titanium nitride, and/or aluminum oxide.

9. The device of claim 1, wherein the top metal layer is disposed above the etch stop layer; and the device further comprises a conductive via disposed through the MEMS structure layer to contact the top metal layer.

10. The device of claim 1, wherein the top metal layer is disposed in sections above the dielectric layer, and further wherein the etch stop layer is disposed between the sections of the top metal layer.

11. A method of fabricating a micro-electro-mechanical systems (MEMS) device, the method comprising:
   providing a substrate;
   forming a dielectric layer above the substrate;
   forming an etch stop layer above the dielectric layer;
   forming a sacrificial layer above the etch stop layer;
   forming a micro-electro-mechanical systems (MEMS) structure layer above the sacrificial layer;
   forming two anchor plugs above the dielectric layer, the two anchor plugs each contacting the etch stop layer or a top metal layer above the dielectric layer;
   patterning the MEMS structure layer to form a release aperture; and
   removing the sacrificial layer between the two anchor plugs and above the etch stop layer through the release aperture of the MEMS structure layer, to form a cavity between and adjacent to the two anchor plugs.

12. The method of claim 11, wherein the etch stop layer is comprised of a dielectric material or a non-conductive material.

13. The method of claim 11, wherein the etch stop layer is resistant to vapor HF, liquid HF, and/or buffered HF.

14. The method of claim 11, wherein the etch stop layer is comprised of AlN, SiC, and/or amorphous carbon.

15. The method of claim 11, wherein the dielectric layer and the sacrificial layer are each comprised of a same material.

16. The method of claim 11, wherein the anchor plugs are formed through the MEMS structure layer and/or the sacrificial layer.

17. The method of claim 11, wherein the anchor plugs are formed of conductive or non-conductive material.

18. The method of claim 11, wherein the anchor plugs are comprised of SiGe, polysilicon, tungsten, titanium nitride, and/or aluminum oxide.

19. The method of claim 11, further comprising:
   forming the top metal layer above the etch stop layer; and
   forming a conductive via through the MEMS structure layer and the sacrificial layer to contact the top metal layer.

20. The method of claim 11, further comprising:
   forming the top metal layer in sections above the dielectric layer; and
   forming the etch stop layer between the sections of the top metal layer.

* * * * *